(12) United States Patent
Capp et al.

(10) Patent No.: US 9,763,007 B2
(45) Date of Patent: Sep. 12, 2017

(54) GROUP DELAY CORRECTION IN ACOUSTIC TRANSDUCER SYSTEMS

(71) Applicant: MERIDIAN AUDIO LIMITED, Huntingdon Cambridgeshire (GB)

(72) Inventors: Michael D. Capp, Huntingdon (GB); John Robert Stuart, Cambridge (GB); Alan S. J. Wood, Sawston (GB); Richard J. Hollinshead, Huntingdon (GB)

(73) Assignee: Meridian Audio Limited, Huntingdon (GB)

( * ) Notice: Subject to any disclaimer, the term of this patent is extended or adjusted under 35 U.S.C. 154(b) by 2 days.

(21) Appl. No.: 14/759,023

(22) PCT Filed: Jan. 7, 2014

(86) PCT No.: PCT/GB2014/050030
§ 371 (c)(1),
(2) Date: Jul. 2, 2015

(87) PCT Pub. No.: WO2014/106756
PCT Pub. Date: Jul. 10, 2014

(65) Prior Publication Data
US 2015/0350786 A1    Dec. 3, 2015

(30) Foreign Application Priority Data

Jan. 7, 2013    (GB) .................................. 1300215.9

(51) Int. Cl.
*H04R 3/00* (2006.01)
*H03G 5/00* (2006.01)
(Continued)

(52) U.S. Cl.
CPC ............... *H04R 3/14* (2013.01); *H03G 5/165* (2013.01)

(58) Field of Classification Search
CPC ... H04R 3/04; H04R 3/12; H04R 3/14; H04R 1/24; H04R 1/26; H04R 1/323;
(Continued)

(56) References Cited

U.S. PATENT DOCUMENTS 6,606,388 B1 *   8/2003   Townsend .............. G10H 1/125
                                                                                    381/1
2008/0013750 A1 *   1/2008   Suzuki ..................... H04R 3/04
                                                                                    381/97

(Continued)

FOREIGN PATENT DOCUMENTS

DE             19533946 A1      6/1996
DE        102010046276 A1      9/2011
(Continued)

OTHER PUBLICATIONS

Patents Act 1977: Search Report under Sections 17), dated Apr. 17, 2013, for GB Application No. GB1300215.9, 4pgs.
(Continued)

*Primary Examiner* — Thang Tran
(74) *Attorney, Agent, or Firm* — Buckley, Maschoff & Talwalkar, LLC

(57) ABSTRACT

Methods are provided for equalizing the group delay of a sound reproduction system, in particular a system comprising acoustic transducers with at least one crossover between a lower-frequency and a higher-frequency range. A correction is applied to a signal in the lower-frequency range, including the crossover region, to substantially equalize the group delay for the lower-frequency range, and a signal delay is applied to a signal in the higher-frequency range to bring it into closer alignment with the equalized lower-frequency range signal. The methods may be implemented in the design of an acoustic transducer system and also via a computer program product, which can be implemented as
(Continued)

an update or enhancement to an existing digital signal processor loudspeaker system.

20 Claims, 6 Drawing Sheets

(51) Int. Cl.
*H04R 3/14* (2006.01)
*H03G 5/16* (2006.01)

(58) Field of Classification Search
CPC ... H04R 2203/12; H04S 2420/07; H04S 5/00; H04S 7/307; H03G 5/165
See application file for complete search history.

(56) References Cited

U.S. PATENT DOCUMENTS

2008/0033730 A1* 2/2008 Jot ..................... H03H 17/0266
704/500
2010/0086148 A1* 4/2010 Hung ..................... H03G 5/165
381/98
2012/0128159 A1* 5/2012 McGrath ................. H04S 1/002
381/17
2012/0321105 A1* 12/2012 McGrath ............... G10L 19/008
381/119

FOREIGN PATENT DOCUMENTS

| GB | 2509533 A | 7/2014 |
| JP | 5528630 A | 2/1980 |
| JP | 59211399 A | 11/1984 |
| JP | 0984173 A | 3/1997 |
| WO | 2014/106756 A1 | 7/2014 |

OTHER PUBLICATIONS

"PCT Notification of the International Search Report and the Written Opinion of the International Searching Authority", dated Mar. 7, 2014 (Jul. 3, 2014), for International Application No. PCT/GB2014/050030, 11pgs.
European Examination Report for Application No. 14700105.1 dated Dec. 20, 2016, 4 pp.

* cited by examiner

GROUP DELAY CORRECTION IN ACOUSTIC TRANSDUCER SYSTEMS

CROSS-REFERENCED TO RELATED APPLICATION

This application is a U.S. National Stage filing under 35 U.S.C. §371 and 35 U.S.C. §119, based on and claiming priority to PCT/GB2014/050030 for "GROUP DELAY CORRECTION IN ACOUSTIC CROSS-OVER NETWORK" filed Jan. 7, 2014, claiming priority to GB patent application no. 1300215.9 filed Jan. 7, 2013.

FIELD OF INVENTION

The present invention relates to methods for equalising the group delay of a sound reproduction system, in particular a system comprising acoustic transducers with at least one crossover between lower- and higher-frequency transducers.

BACKGROUND TO THE INVENTION

Multi-way loudspeakers that use two or more drive units to convey a range of audio frequencies require filters at the crossover points to ensure a well formed magnitude response. However, these filters may combine to introduce a raised group delay on certain frequencies which may cause a smearing of the perceived sound.

Several methods are known that avoid uneven group delay through a crossover, including the use of first-order crossover responses or those derived using a subtractive method [Small, R. H., "Constant Voltage Crossover Design", Proc IREE Australia, Vol 31 No 3, 1970 March, pp. 66-73], the use of a filler-driver [Baekgaard, E, "A Novel Approach to Linear Phase Lousdpeakers using Passive Crossover Networks", J. Audio Eng. Soc, Vol 25, No 5, pp 284-294] and linear-phase crossovers normally derived using digital signal processing (DSP).

Methods are also known for smoothing the group delay introduced by a crossover system by applying a complementary all-pass correction [Linkwitz, S. H., "Active Crossover Networks for Non-Coincident Drivers", J. Audio Eng Soc, Vol 24 No 1/2, 1976 January/February, pp. 2-8].

An acoustic transducer normally has a natural low-frequency cut off and the combination of a transducing element on a baffle or in an enclosure exhibits a high-pass frequency response which may be modelled as a high-pass filter system. This high-pass response can present significant or uneven group delay. The increase in low frequency group delay near system cut-off may be of the order of the period of the cut-off frequency. If left uncorrected, a listener can observe the low frequency components of a composite sound signal arriving after their higher frequency counterparts.

According to the overall design of the transducer and enclosure, the low-frequency response can exhibit slower-roll off (in an over-damped system), a second-order high-pass response in a closed-box system, a fourth-order high-pass in a system incorporating a vent, auxiliary radiating element or coupled cavity, or any of these in conjunction with an additional auxiliary filter which preconditions the audio so as to provide low-frequency extension, optimise alignment, or introduce intermediate or higher-order high-pass responses. In general, systems will exhibit a raised group delay at some low frequencies as a result of the overall system design and that delay bump will tend to be lower in proportion to the order of the overall system acoustic response. For this reason, for certain high-quality applications closed-box loudspeakers have hitherto been preferred over vented or higher-order designs.

The high-pass response of a loudspeaker system can be modelled as a filter which may in turn be factored into a cascade of first and second-order elements, some of which will relate to the mechanical properties of the transducer in its enclosure and others to pre-processing of the signal. It is also known that a higher-order response, such as sixth-order Butterworth, can be designed in four ways which combine pairs of its second-order factors to synthesise the mechanical system, while the third can be an auxiliary filter; normally the combinations are selected to provide the smallest enclosure volume. [Thiele, A. N. (1973). "Loudspeakers, Enclosures and Equalisers," Proc. IREE, 34(11), pp. 425-448.]

Non-real-time methods are known, whereby audio can be pre-processed in reverse time through an all-pass filter having the same phase response as the total system; this audio when later reproduced results in a uniform group delay response. However, it is not always convenient to pre-process the audio and particularly is inconvenient to do so for different designs.

It is not possible to use a real-time causal stable filter to impart a negative delay to compensate for unwanted group delay. However, an all-pass filter which has a flat magnitude response may be used to add group delay at a specific range of frequencies. A method that adds a series of all-pass filters to carry out limited equalisation is described in M. F. Quélhas, A. Petraglia, and M. R. Petraglia, "Efficient group delay equalization of discrete-time IIR filters", European Signal Processing Conference, pp. 125-127, 2004. However, this approach alone does not provide sufficient means for equalising the group delay of the entire multi-way loudspeaker.

In real-time, to obtain a uniform group delay it is necessary to delay the entire audio so that no part arrives earlier than the latest component arriving from the overall system; that maximum group delay is normally associated with the system low-frequency high-pass response and may be several tens of milliseconds.

In principle, an all-pass filter can be designed to correct for a high-pass response. However, to cover the frequency range from below 100 Hz to above 20 kHz would require a very large number of filters (of the order of five hundred second order all-pass filters evenly spaced across the required frequency range) and risk the accumulation of considerable noise.

Real-time techniques involving reverse block processing of a signal have also been described that do provide an opportunity for equalising the group delay, such as in Adam, V. and Benz, S., "Correction of crossover phase distortion using reversed time all-pass IIR filter", Audio Engineering Society, 122$^{nd}$ Convention, Paper 7111, 6 pp., 2007. However, for precise high-sample-rate systems these approaches require very large buffers to ensure that filter states converge at the block or buffer boundaries. This method also imposes a significant start-up delay on the audio whilst adequate buffers are filled and such delay may for example be incompatible with associated video.

As will be appreciated from the above discussion, there is a need for a practical method for implementing group delay equalisation of multi-way loudspeakers with low additional latency.

SUMMARY OF THE INVENTION

According to a first aspect of the present invention, there is provided a method for equalising the overall group delay in the response of an acoustic transducer system having a crossover between a lower-frequency range and a higher-frequency range, the method comprising the steps of:
applying correction to a signal in the lower-frequency range, including the crossover region, to substantially equalise the group delay for the lower-frequency range; and,
applying a signal delay to a signal in the higher-frequency range to bring it into closer alignment with the equalised lower-frequency range signal.

According to a second aspect of the present invention, a computer program product comprises computer executable code which when executed on a processor of an acoustic transducer system causes the system to perform the method of the first aspect.

According to a third aspect of the present invention, an acoustic transducer system is adapted to perform the method of the first aspect.

The present invention relates to methods for equalising the variation of group delay with frequency in sound reproducing systems which comprise one or more transducers that together reproduce a lower-frequency range and one or more other transducers that reproduce an overlapping or adjoining upper-frequency range, and where the two ranges are unified by a crossover means. Such systems may be assembled as multiple transducer combinations in one overall baffle or enclosure or in a headphone or as combinations of separately housed woofer and higher-range loudspeakers.

In one embodiment of the invention the method adjusts the signals fed to a lower-frequency reproducing combination using all-pass filters to normalise the group delay over that frequency range, while simpler time-delay means adjust the signals fed to corresponding upper-frequency combination(s). The invention thus equalises the group delay of a sound reproduction system comprising acoustic transducers with at least one crossover between lower-frequency and higher-frequency transducers and which can operate in real-time with low latency.

Within a multi-way system incorporating more than one crossover, the methods may be applied more than once; for example first correcting group-delay irregularity in a combination of mid-range and tweeter and then correcting overall group-delay irregularity between that combination and an associated woofer.

The methods of the present invention may be implemented as signal-processing elements within a multi-way loudspeaker system or as signal-processing elements within separate loudspeaker systems, including separate woofer with satellite combinations including where the numbers of satellites and woofers are not necessarily equal, in such a way that the overall response achieves the desired corrected group delay.

The methods may also be used within a controller or pre-processor device, including within a surround-sound or home-theatre decoder, processor or receiver, to adjust signals fed to multiple loudspeakers so as to equalise variations in group delay in the resulting sound. The methods may also be applied to the design of a signal-processor which uses internal band-split and recombination to more efficiently provide compensation for a loudspeaker system where there is no access to the crossover.

The methods described may also be used in the design of a multi-way acoustic reproducer to enable more uniform group delay where the underlying acoustic design would otherwise be less appropriate.

In some embodiments of the invention the correction is incorporated at the design stage so as to enable adequate system performance to be achieved from a transducer system whose natural group-delay response would otherwise be unacceptable, for example as might result if: (i) a high-order system design such as $10^{th}$ order was used to extend the response of a smaller cabinet, or (ii) where methods of extending the acoustic low-frequency response of a mid-range system otherwise confused the crossover design.

The methods described may be implemented as analogue or digital processing means to obtain the low-frequency all-pass response while the delay for the upper section can use acoustic, analogue or digital memory or other means.

The methods described may also be implemented in software as an improvement to existing systems using a digital signal processor (DSP).

Although the present invention does not relate to correction of crossovers as such, it does facilitate additional methods for optimising the design of a crossover by virtue of the near-uniform group delay realised using the invention.

In a first embodiment of the invention a series of all-pass filters are designed to equalise the group delay of the low frequency signal within a multi-way loudspeaker up to and somewhat above the relevant cross-over frequency. As the frequency range between the system roll-off and the crossover may be only a few octaves, this correction can be accomplished using a relatively small number of all-pass filter elements. The all-pass system is designed so as to present uniform delay to relevant frequencies when combined with the low-frequency transducer system. The signal fed to the higher-frequency signal paths can then be delayed appropriately by other means and this may then result in an overall system which provides consistent group delay across the entire frequency range, and consequently present a cleaner overall sounding result.

A second embodiment of the invention utilises a reverse block processing technique providing a means to filter the low-frequency audio signal backwards, effectively implementing an apparent negative group delay on the forward signal. Because this processing need only be applied to the lower-frequency section of a multi-way system, problems of state convergence can be overcome by down-sampling the low frequency signal prior to application of a series of equalising all-pass filters. Overall audio alignment with the high-frequency system is obtained through pure delay methods within the high frequency signal paths.

A third embodiment of the invention employs a pre-processor with one input and one output per loudspeaker system and which is designed to provide a signal which equalises the low-frequency group delay of an external loudspeaker. The process uses band-split means to divide the signal into a low-frequency part within which path all-pass filters can be used to provide an appropriate group delay and into a high-frequency part which path contains a pure delay. Upper and lower ranges are then recombined by a band-join method, which may be a simple addition, to provide the pre-compensated signal.

The computer program product of the second aspect of the invention may implemented as an update or enhancement to an existing digital signal processor (DSP) loudspeaker system, or else as an update or enhancement to an existing multichannel or stereo audio processor.

An acoustic transducer system according to the third aspect of the invention may comprise low and upper range sections of a multi-way loudspeaker or other transducer combination. Alternatively, or additionally, it may comprise any frequency-adjacent pair of driver ranges in a multi-way system, not including the lowest-frequency range, such as between tweeters or between a mid-range and tweeter combination.

In some embodiments the acoustic transducer system may comprise a low-frequency system in a separate enclosure or cabinet, such as a sub-woofer, in combination with one or more loudspeakers, wherein there exists a crossover, whether acoustic or by filter means.

In some embodiments the acoustic transducer system may comprise signal processing within an associated element for performing the method in conjunction with a combination of loudspeaker systems or other transducers, including surround processors, home theatre receivers and similar devices, which may include bass management, crossover and alignment methods.

In some embodiments the acoustic transducer system may comprise a compensating signal-processing device, wherein lower-frequency range and higher-frequency range paths are internal and created by bandsplit means, but wherein the post-correction recombination of low and high-frequency signals occurs in signal processing by bandjoin means, so as to provide a composite signal corrected for the acoustic transducer system where there is no access to any crossover or where the system is full-range.

As will be appreciated by those skilled in the art, the present invention is capable of various implementations according to the application. Moreover, the invention facilitates other design options for the acoustic transducer system, for example relating to the form of the crossover, which may take advantage of the group delay correction afforded by the present invention.

BRIEF DESCRIPTION OF THE DRAWINGS

Examples of the present invention will be described in detail with reference to the accompanying drawings, in which.

DETAILED DESCRIPTION

The present invention may be implemented in a number of different ways according to the acoustic transducer system being used. The following describes some example implementations with reference to the figures.

All-Pass Filter Correction

Figure 1:
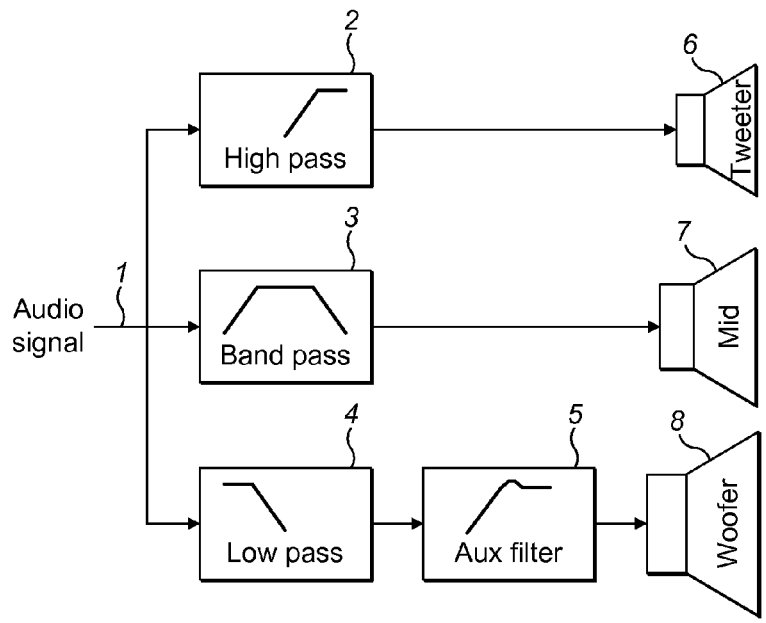
FIG. 1 shows a basic flow diagram of a multi-way loudspeaker, in this case a three-way loudspeaker comprising three driver units.

A multi-way loudspeaker consists of two or more sets of drive units, where each set may consist of one or more loudspeaker driver units and may be considered the end point of a different signal path. The flow diagram in FIG. 1 shows one such possible three-way loudspeaker system in which the audio signal 1 is passed through a different filter set for each drive unit. A low pass filter 4 and an aux filter 5 to extend the bass response is used for the woofer driver 8 signal; a band pass filter 3 for the mid-range 7 drive unit signal; and a high pass filter 2 for the tweeter 6 signal.

Each drive unit in a multi-way loudspeaker operates over a different but overlapping frequency range. Consequently, for an ideal loudspeaker each signal path should be filtered to ensure the crossover point of each drive unit combine such that the overall magnitude and phase response of the entire loudspeaker meets a desired response.

Figure 2:
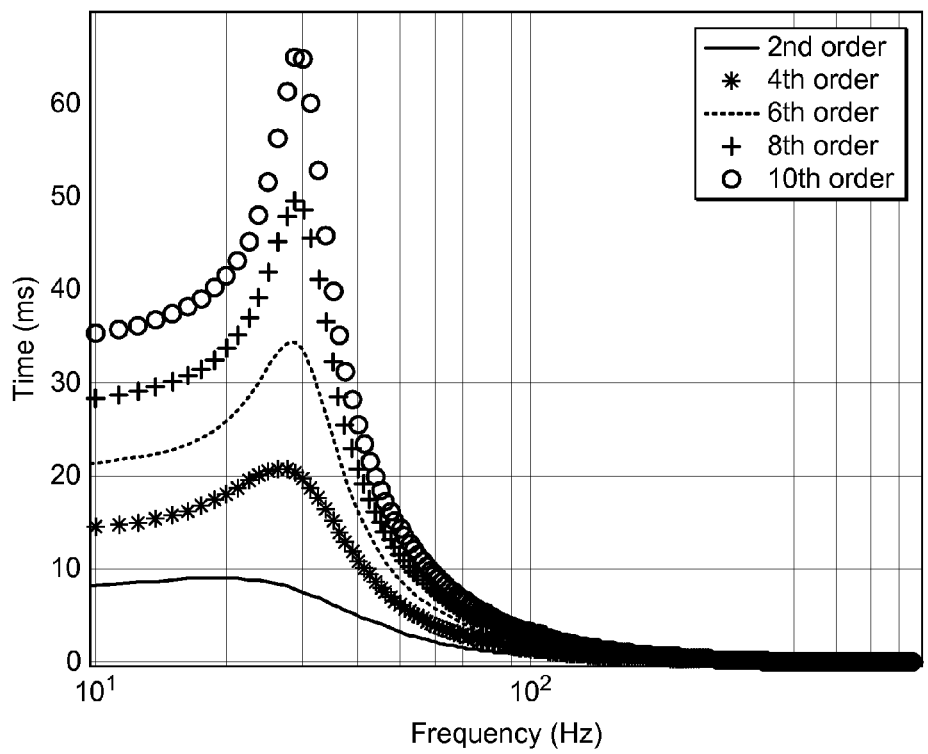
FIG. 2 is an example of low frequency group delay for second, fourth, sixth, eighth and tenth-order loudspeakers.

FIG. 2 shows the dominating low frequency characteristics of the group delay for various three-way loudspeaker cabinets. The significant group delay, most visible in this example around 25 Hz, will cause low frequency sounds to arrive after their associated high frequency components or transients, blurring and generally degrading the overall auditory result.

A known method for adjusting the group delay of a system without altering the overall magnitude response is through the use of all-pass filters as described in M. F. Quélhas, A. Petraglia, and M. R. Petraglia, "Efficient group delay equalization of discrete-time IIR filters", European Signal Processing Conference, pp. 125-127, 2004. The transfer function of a second order digital all-pass filter may be defined as:

$$A(z) = \frac{b + az^{-1} + z^{-2}}{1 + az^{-1} + bz^{-2}}$$

The parameters a and b are chosen according to the requirements of the filter, where $$a = -2r \cdot \cos\left(\frac{2\pi f_c}{F_s}\right)$$

and $b=r^2$. Where r corresponds to the radius of the filter pole (the zero radius being given as $1/r$) with $r<1$ required to ensure a stable causal filter, $f_c$ is the centre frequency, and $F_s$ is the sampling frequency.

Figure 3:
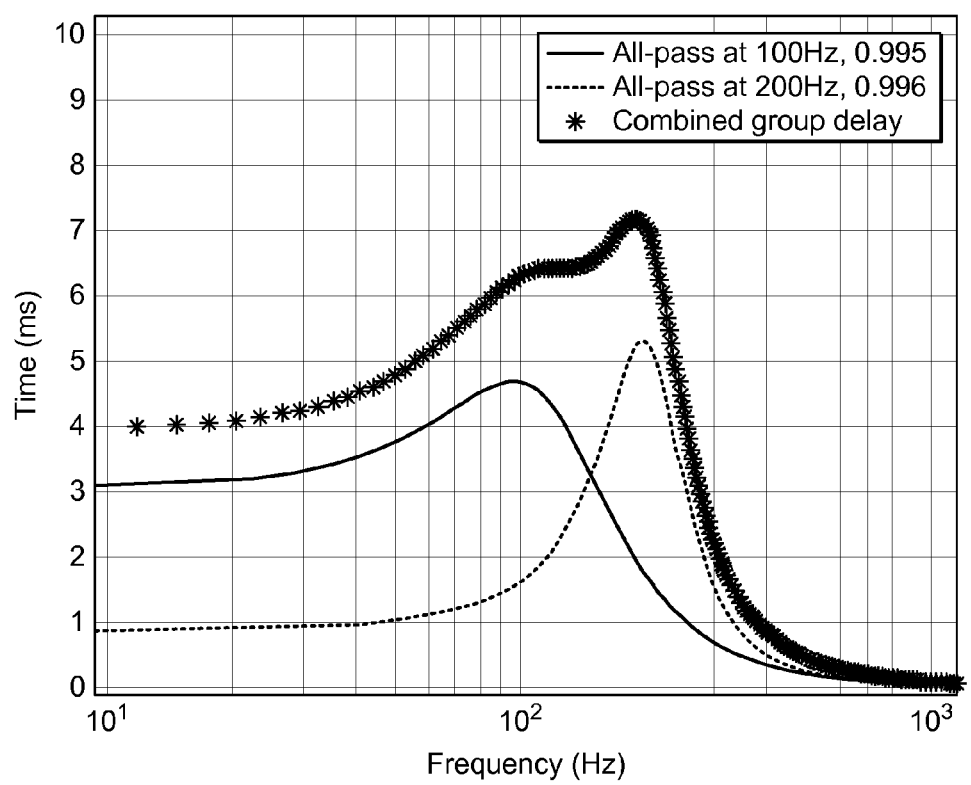
FIG. 3 shows two examples all pass filters and their combined group delay.

FIG. 3 shows an example of the overall group delay obtained from two second order all-pass filters with $F_s$ of 96000 Hz, $f_c$ equal to 100 Hz and 200 Hz, and r corresponding to 0.995 and 0.996, respectively.

Ideally, a set of all-pass filters with a negative group delay would be required to equalise the group delay of a loudspeaker cabinet, such as those shown by the curves in FIG. 2. However, although it is possible to design an all-pass filter to have a negative group delay, the filter will be acausal making the entire system unstable.

An alternative solution would require hundreds of all-pass filters to create a flat positive group delay across the entire frequency range from low to high. This number of filters would generally be impractical in terms of real-time implementation and introduce significant build-up of noise.

Figure 4:
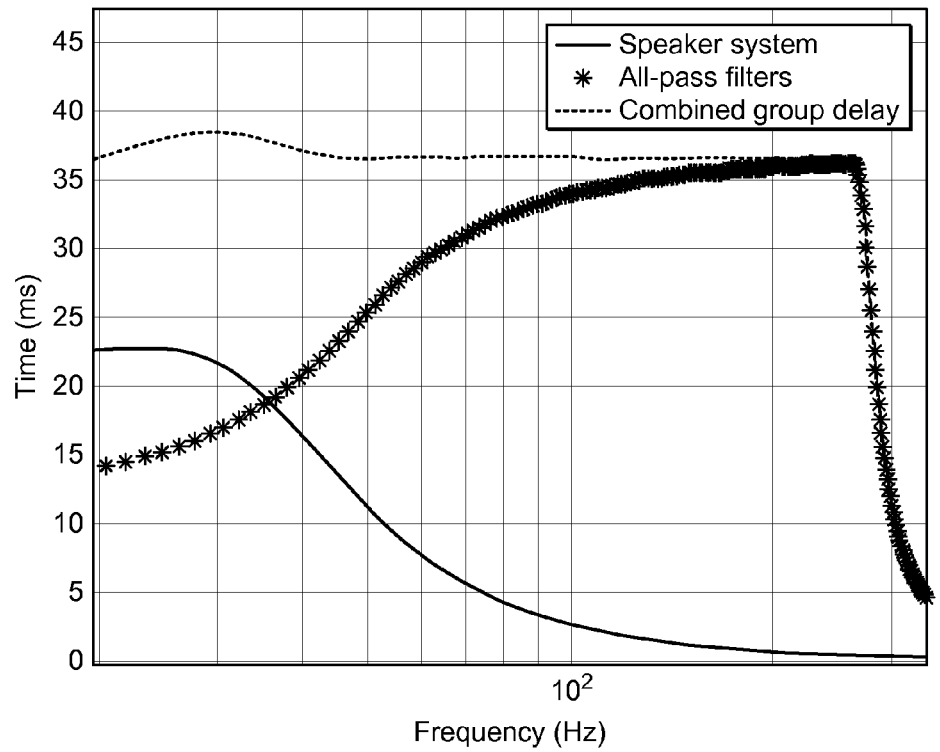
FIG. 4 shows a partial group delay equalisation using eight all-pass filters and the perceived overall delay once delay lines have been applied.

Consequently, the first embodiment of this invention applies a sequence of all-pass filters to the low frequency path to equalise the group delay response of the loudspeaker to a frequency sufficiently beyond the crossover frequency of the woofer signal path. For instance, assuming an $8^{th}$ order Linkwitz-Riley low-pass roll off for the woofer, the magnitude response will be 24 dB down half an octave above the crossover frequency, at which point the waveform will be sufficiently reduced to ensure negligible group delay interference. FIG. 4 shows the group delay of a set of eight equalising second order all-pass filters as well as the group delay for the loudspeaker system and the combined group delay.

Figure 5:
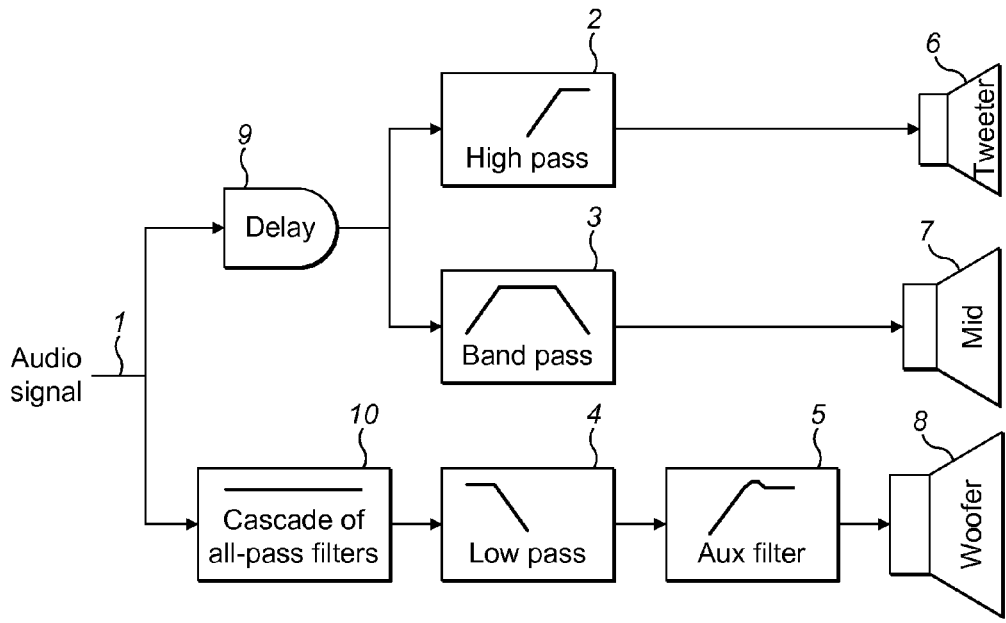
FIG. 5 shows a flow diagram of a three-way loudspeaker incorporating a series of all pass filters on the low frequency or woofer drive unit, and a delay line for the remaining signal paths to align the overall group delay of the system.

The full group delay equalisation is now achieved by delaying the signal in additional signal paths, which correspond to the mid-range and tweeter feeds in the current example. In this example, delay is introduced within memory buffers of a DSP system. As shown by the flow diagram of FIG. 5, the buffers implement a pure delay 9 which corresponds to the equalised low-frequency system group delay.

Thus, in the first embodiment of the invention a series of all-pass filters are applied to equalise or the low-frequency path using positive group delays to a target uniform delay level and accomplished in such a way as to provide an appropriate phase at the cross-over frequency, and then an equivalent delay is inserted into the remaining audio paths, which in this embodiment corresponds to the mid-range and tweeter feeds.

Although illustrated as correction between a woofer and mid-range section, an equivalent embodiment would correct between a woofer system and a one-way or multi-way upper frequency reproducer. This method can also be applied to flatten the group delay of a midrange-tweeter system which in turn can be combined with a woofer using the same method.

Steps:
- Using an iterative process to apply and adjust a series of all pass filters, equalise the group delay response of the low frequency component of the loudspeaker to a positive time delay across the frequency range of interest.
- Extend the equalisation up to and beyond the crossover frequency of the low frequency drive unit.
- Implement delay within the remaining high frequency loudspeaker feeds, e.g., mid-range and tweeter.
- Ensure the overall loudspeaker response knits well at the crossovers, adjusting the filters and delay lines appropriately.

Reverse Block Processing

An alternative approach to compensate for positive group delay using all-pass filters is to process a signal in reverse. A series of all-pass filters with positive group delay may be constructed that normalise the group delay of the low frequency signal path of a multi-way loudspeaker. Once calculated these filters may be applied to a known signal in reverse time before audition. However, for a real-time system this is impractical. Hence, a second embodiment of the invention makes use of reverse block processing enabling the additive group delay of all-pass filters to be effectively subtracted from the low-frequency signal path in real-time, which when combined with pure delay methods for the high frequency signal paths can effectively equalise the entire system.

Figure 6:
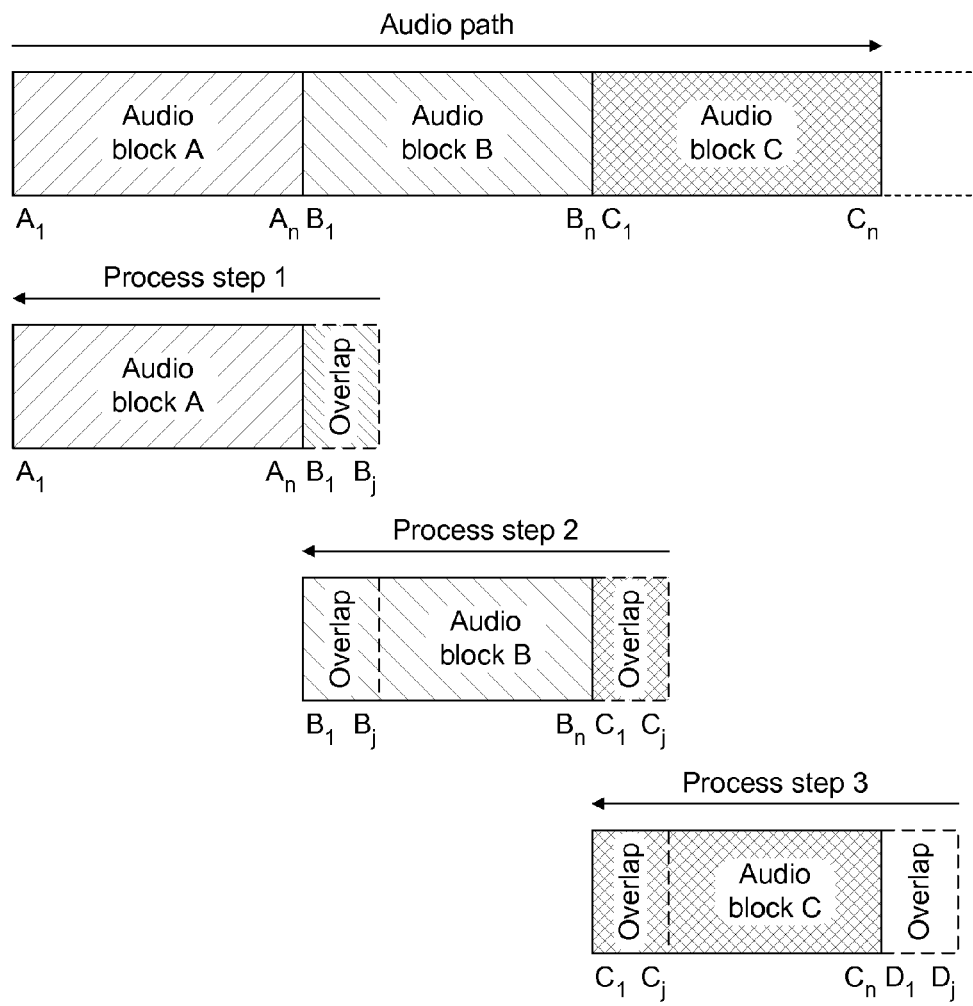
FIG. 6 illustrates a method for breaking up an audio signal into blocks for reverse block processing, wherein each block is processed as an individual step.

One such application of reverse-block processing is portrayed in FIG. 6, in which two or more buffers may be used to facilitate the process. The system will present an initial start-up delay whilst the buffers fill for the first time, which may be compensated for via a pure delay within the high-frequency paths. The buffers may be treated as a form of Last In First Out (LIFO) buffer, as they are filled with the forward signal but the filters are applied starting with the last sample first.

Processing of the first buffer, A, may commence as soon as buffer B has been filled, or at least the region occupied by the overlap, $B_1$ to $B_j$. Where $1<j<<n$, with j corresponding to the sample offset of the overlap region within a block buffer of length n. This overlap is necessary to ensure filter states have stabilised sufficiently to provide accurate filtering of buffer A to prevent discontinuities in the processed signal at the block boundaries.

A third buffer may be used allowing filtering of the region from $B_j$ backwards to $A_1$, whilst additional audio is buffered in a block C in preparation for the next processing step, namely filtering of block B (samples $C_j$ to $B_1$). Once a block has been filtered it may be passed to the output path for audition, and the corresponding buffer freed for reuse.

Unless additional buffers are used to allow for error checking, the overlap region of length j should be of sufficient size to ensure that filter states stabilise. However, for high sample rate signals a large and generally impractical number of samples will be required for filter state stabilisation to attain an acceptable level for a high precision system. Such large numbers of samples would require a suitably fast processor, large buffers and long delays on system start whilst the buffers fill.

Figure 7:
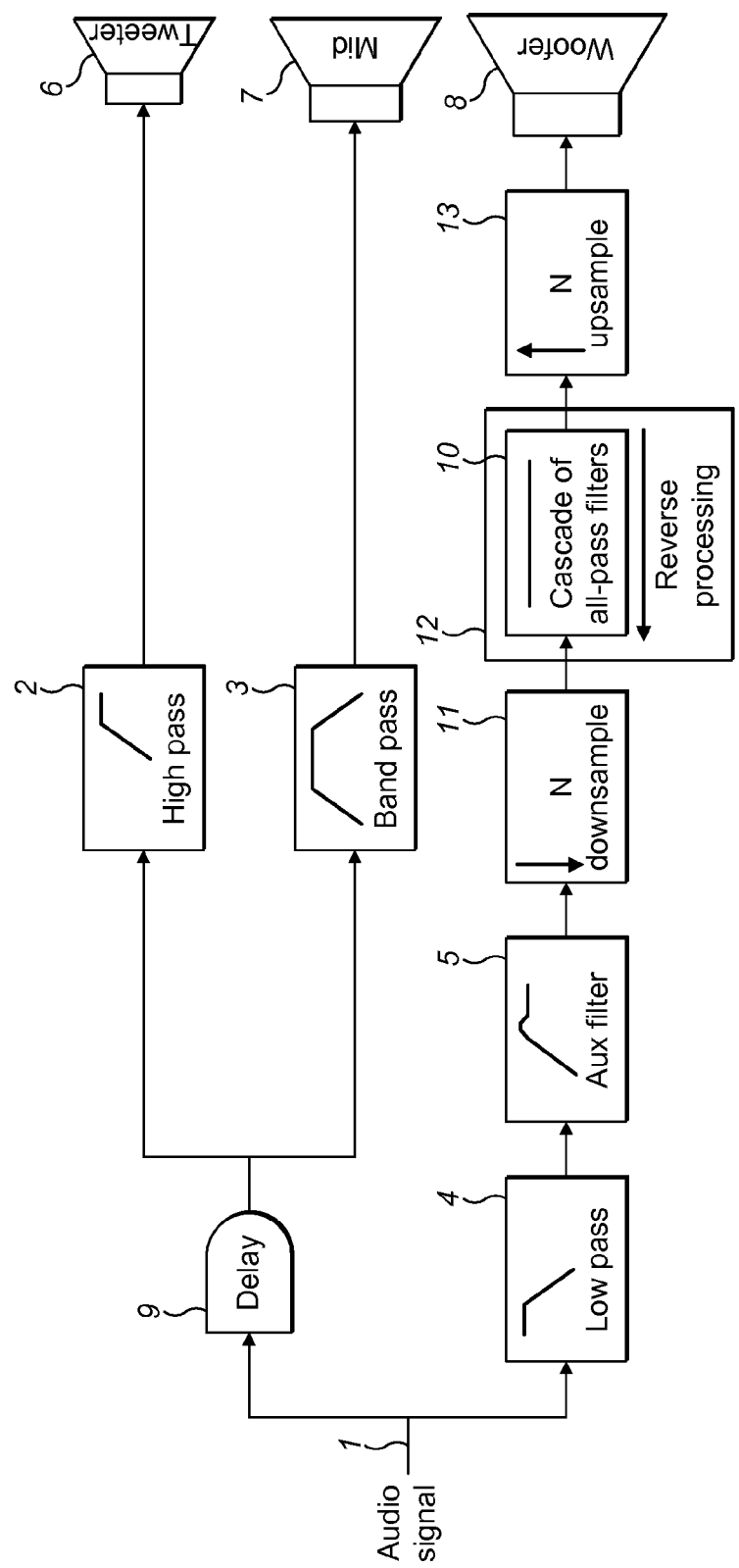
FIG. 7 shows a flow diagram for a three-way loudspeaker system that performs reverse-block processing on the low-frequency signal path so that a sequence of all-pass filters can be used to negate the overall group delay. A pure delay is used in the high-frequency paths to align the loudspeaker outputs; and, FIG. 8 shows a flow diagram for a pre-processor unit that carries out a bandsplit on the input signal, corrects the group delay on the low-frequency path and applies a compensatory pure delay to the high-frequency path, before recombining at the output via a bandjoin process.

A solution is provided, as shown in FIG. 7, by down-sampling 11 the low-frequency signal (which has already been suitably low-pass filtered 4) by an integer factor N prior to reverse-block processing 12 and all-pass filtering 10. After this, the processed signal may be up-sampled 13 again, if required. Down-sampling reduces the frequency range over which the signal relates and as such the states of the equivalent lower sample rate all-pass filters stabilise significantly faster than the original high sample rate versions.

This second embodiment of the invention uses a method of reverse-block processing a lower frequency signal with a series of all-pass filters designed such that they compensate for the positive group delay of the system. To facilitate filter state convergence at buffer or block boundaries the signal may be down-sampled prior to group delay correction via the all-pass filters. Finally the corrected signal may be up-sampled to return it to the original sample rate. The higher frequency signal paths utilise a pure delay equivalent to the time taken for a sample to pass through the low-frequency filter process, including down-sampling, reverse-processing, all-pass filtering, and up-sampling.

Steps:
- Down-sample the low-frequency signal.
- Reverse-block process the down-sampled low-frequency signal.
- Apply a cascade of all-pass filters designed to match the system group delay, thus cancelling the positive group delay in reverse time.
- If necessary, prior to output up-sample the low-frequency signal back to its original or a different sample rate.
- Apply a pure delay to the high-frequency signal paths corresponding to the time delay imposed on the low-frequency signal path by buffering during reverse-block processing.

Pre-Processing

Figure 8:
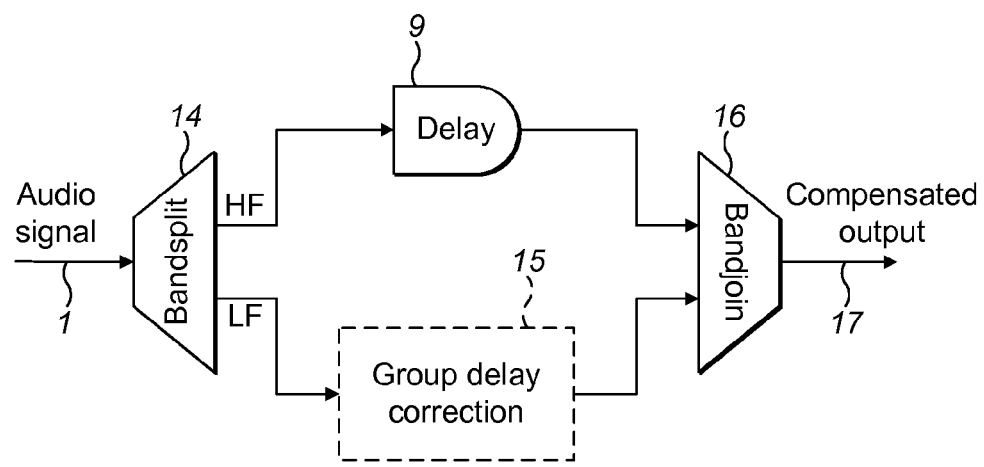

A third embodiment of the invention, as shown in FIG. 8, considers a pre-processor with one input and one output per loudspeaker system and which is designed to provide a signal which equalises the low-frequency group delay of an external loudspeaker. The process envisaged uses a band-split means 14 to divide the signal into a low-frequency part, as indicated by LF in FIG. 8, and a high-frequency part, HF. The low-frequency path passes through a group delay correction block 15 that implements all-pass filters in the manner of embodiment 1 or embodiment 2. Similarly, the high-frequency path contains a pure delay 9, which is appropriate to the first or second embodiments of the invention.

The processed upper and lower ranges are then recombined by a band-join method 16, which may be a simple addition, to provide the pre-compensated signal 17.

Steps:
- Band-split the audio signal into low and high-frequency components.
- Apply group delay correction methods to the low-frequency signal path. This may utilise all-pass filters and a down-sampling/up-sampling stage as described in embodiment 1, or reverse-block processing from embodiment 2 of the invention.
- Apply a pure delay to the high-frequency component equivalent to the delay either required or imposed by the processing on the low-frequency path depending on the use of embodiment 1 or embodiment 2 of the invention.
- Recombine the group delay corrected low-frequency and high-frequency components of the audio signal using a band-join process.

The invention claimed is:

1. A method for equalising overall group delay in the response of an acoustic transducer system having a crossover for dividing an input signal between a lower-frequency range and a higher-frequency range, the method comprising the steps of:
   obtaining a first signal and a second signal derived from the input signal;
   equalising the first signal in the lower frequency range by applying a correction to the first signal in the lower-frequency range, including the crossover region, to equalise a group delay of the lower-frequency range when subject to the response of the acoustic transducer system; and
   aligning a timing of the second signal in the higher-frequency range into closer alignment with a timing of the equalised first signal in the lower-frequency range when subject to the response of the acoustic transducer system by applying a signal delay to the second signal.

2. A method according to claim 1, further comprising joining the equalised first signal and the aligned second signal to generate an output signal, and wherein the obtaining comprises splitting the input signal into the lower-frequency range and the higher-frequency range to derive the first and second signal, respectively.

3. A method according to claim 2, wherein the splitting is performed using a bandsplit process, and the joining is performed using a band-join process.

4. A method according to claim 1, wherein the applying the correction to the first signal in the lower-frequency range comprises applying at least one all-pass filter to the first signal in the lower-frequency range, including the crossover region, to equalise the group delay of the lower-frequency range.

5. A method according to claim 4, wherein the applying the correction to the first signal in the lower-frequency range comprises applying a combination of all-pass filters to the first signal in the lower-frequency range, including the crossover region, to equalise the group delay of the lower-frequency range.

6. A method according to claim 1, wherein the applying the correction to the first signal in the lower-frequency range comprises applying a combination reverse-block processing to the first signal in the lower-frequency range, including the crossover region, to equalise the group delay for of lower-frequency range.

7. A method according to claim 6, wherein the combination reverse-block processing comprises reverse-block processing the first signal in the lower-frequency range, including the crossover region, to determine an all-pass filter combination which would substantially equalise the group delay of the low-frequency range, and applying the determined all-pass filter combination to said first signal in the lower-frequency range signal to equalise the group delay.

8. A method according to claim 7, further comprising down-sampling the first signal in the lower-frequency-range prior to the combination reverse-block processing.

9. A method according to claim 8, further comprising up-sampling the equalised first signal to its original or a different sample rate.

10. A method according to claim 6, wherein the combination reverse-block processing of the first signal utilises a plurality of buffers.

11. A method according to claim 6, wherein the applying the signal delay to the second signal comprises buffering the second signal in the higher-frequency range during the combination reverse-block processing of the first signal.

12. A non-transitory computer-readable medium storing instructions which, when executed by a processor, cause the processor to perform operations for equalizing an overall group delay in a response of an acoustic transducer system having a crossover for dividing an input signal between a lower-frequency range and a higher-frequency range, the operations comprising:
   obtaining a first signal and a second signal derived from the input signal;
   equalising the first signal in the lower frequency range by applying correction to a the first signal in the lower-frequency range, including the crossover region, to equalise a group delay of the lower-frequency range when subject to the response of the acoustic transducer system; and
   aligning a timing of the second signal in the higher-frequency range into closer alignment with a timing of the equalised first signal in the lower-frequency range when subject to the response of the acoustic transducer system by applying a signal delay to the second signal.

13. A non-transitory computer-readable medium according to claim 12, wherein the instructions are implemented as an update or an enhancement to an existing digital signal processor (DSP) loudspeaker system.

14. A non-transitory computer-readable medium according to claim 12, wherein the instructions are implemented as an update or an enhancement to an existing multichannel or stereo audio processor.

15. An acoustic transducer system having a crossover for dividing an input signal between a lower-frequency range and a higher-frequency range, the acoustic transducer system comprising:
   a unit for obtaining a first signal and a second signal derived from the input signal;
   a correction component to equalise the first signal in the lower-frequency range, including the crossover region, by applying correction to equalize a group delay of the lower-frequency range; and a delay component to align a timing of the second signal in the higher-frequency range into closer alignment with a timing of the equalized first signal in the lower-frequency range by applying a signal delay to the second signal.

16. An acoustic transducer system according to claim 15, comprising low and upper range sections of a multi-way loudspeaker or other transducer combination.

17. An acoustic transducer system according to claim 15, further comprising a frequency-adjacent pair of driver ranges of a multi-way system, not including the lowest-frequency range.

18. An acoustic transducer system according to claim 15, further comprising a low-frequency system in a separate enclosure or cabinet and one or more loudspeakers, wherein there exists a crossover.

19. An acoustic transducer system according to claim 15, further comprising a compensating signal-processing device which comprises:

a band splitter for splitting the input signal into the lower-frequency range and the higher-frequency range to derive the first signal and the second signal respectively; and a band joiner for joining the equalised first signal and the aligned second signal to provide a composite signal which equalises the overall group delay of the acoustic transducer system.

20. A compensating signal-processing device for equalising overall group delay in the response of an acoustic transducer system having a crossover for dividing an input signal between a lower-frequency range and a higher-frequency range, the device comprising:

a band splitter for splitting the input signal into the lower-frequency range and the higher-frequency range to derive a first signal and a second signal respectively;

a correction component to equalise the first signal in the lower-frequency range, including the crossover region, by applying correction to equalize a group delay of the lower-frequency range when subject to the response of the acoustic transducer system;

a delay component to align a timing of the second signal in the higher-frequency range into closer alignment with a timing of the equalized first signal in the lower-frequency range when subject to the response of the acoustic transducer system by applying a signal delay to the second signal; and a band joiner for joining the equalised first signal and the aligned second signal to provide a composite signal which equalises the overall group delay of the acoustic transducer system.

* * * * *